United States Patent
Park

(10) Patent No.: US 7,439,130 B2
(45) Date of Patent: Oct. 21, 2008

(54) SEMICONDUCTOR DEVICE WITH CAPACITOR AND METHOD FOR FABRICATING THE SAME

(75) Inventor: Jeong Ho Park, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 128 days.

(21) Appl. No.: 11/612,606

(22) Filed: Dec. 19, 2006

(65) Prior Publication Data

US 2007/0155091 A1    Jul. 5, 2007

(30) Foreign Application Priority Data

Dec. 29, 2005    (KR)    .............. 10-2005-0134446

(51) Int. Cl.
*H01L 21/00* (2006.01)
(52) U.S. Cl. .................. 438/253; 438/243; 438/244
(58) Field of Classification Search .............. 438/253, 438/243–244
See application file for complete search history.

(56) References Cited

U.S. PATENT DOCUMENTS

| | | | | |
|---|---|---|---|---|
| 6,174,803 | B1 * | 1/2001 | Harvey .................. | 438/638 |
| 6,271,084 | B1 * | 8/2001 | Tu et al. .................. | 438/253 |
| 6,313,026 | B1 * | 11/2001 | Huang et al. ............ | 438/625 |
| 6,391,713 | B1 * | 5/2002 | Hsue et al. .............. | 438/253 |
| 6,441,494 | B2 * | 8/2002 | Huang et al. ............ | 257/774 |
| 6,717,193 | B2 * | 4/2004 | Olewine et al. .......... | 257/295 |
| 6,794,262 | B2 * | 9/2004 | Ning et al. ............... | 438/396 |
| 6,958,509 | B2 * | 10/2005 | Korner et al. ............ | 257/306 |
| 7,071,054 | B2 * | 7/2006 | Park ....................... | 438/243 |
| 7,071,057 | B2 * | 7/2006 | Park ....................... | 438/253 |
| 2005/0082592 | A1 * | 4/2005 | Chang et al. ............. | 257/306 |
| 2005/0142737 | A1 * | 6/2005 | Park ....................... | 438/253 |
| 2005/0170583 | A1 * | 8/2005 | Park ....................... | 438/253 |
| 2007/0155091 | A1 * | 7/2007 | Park ....................... | 438/253 |

* cited by examiner

*Primary Examiner*—Laura M Menz
(74) *Attorney, Agent, or Firm*—Saliwanchik, Lloyd & Saliwanchik

(57) ABSTRACT

A method of fabricating a semiconductor device having a capacitor is provided. The method includes forming second, third, fourth, and fifth insulating layers on a first conductive layer formed in a first insulating layer. The fourth insulating layer is patterned into a first pattern before forming the fifth insulating layer thereupon. A capacitor and contact plug are formed by etching the fifth insulating layer to expose the first pattern; etching the third insulating layer using the exposed first pattern as a mask to expose the second insulating layer; exposing the first conductive layer at a capacitor region and contact plug region by etching the exposed second insulating layer; forming a second conductive layer on the exposed first conductive layer and sidewalls of the insulating layers; forming a dielectric on the second conductive layer in the capacitor region; and filling the capacitor and contact plug regions with a third conductive layer.

11 Claims, 6 Drawing Sheets

SEMICONDUCTOR DEVICE WITH CAPACITOR AND METHOD FOR FABRICATING THE SAME

RELATED APPLICATION(S)

This application claims the benefit under 35 U.S.C. §119(e) of Korean Patent Application No. 10-2005-0134446 filed Dec. 29, 2005, which is incorporated herein by reference in its entirety.

FIELD OF THE INVENTION

The present invention relates to a fabricating method of a semiconductor device having a capacitor, and more particularly, to a semiconductor device having a capacitor and a fabricating method thereof, capable of simplifying the manufacturing process and increasing the capacitance of the capacitor.

BACKGROUND OF THE INVENTION

A Merged Memory Logic (MML) device, which has recently appeared in applications, is a device including a Dynamic Random Access Memory (DRAM) and peripheral circuits integrated on a single chip.

By virtue of the appearance of such an MML, functions of multimedia are significantly improved, and high-integration and high-speed operation of a semiconductor device can be effectively achieved. Meanwhile, for analog circuits requiring high-speed operation, semiconductor devices for realizing a mass storage capacitor are being developed. In general, where a capacitor has a Polysilicon-Insulator-Polysilicon (PIP) structure, the top electrode and the bottom electrode include conductive polysilicon. Because the top/bottom electrodes are formed from polysilicon, the capacitance decreases because of the natural oxide layers that form due to an oxidation reaction occurring at the interfacial surface between the top/bottom electrodes and a dielectric thin film.

Further, due to a depletion region formed in a polysilicon layer, the capacitor of the PIP structure has another disadvantage in that the capacitance decreases and becomes unsuitable for high-speed and high-frequency operation.

In order to solve the above problems, there has been proposed a capacitor having a Metal-Insulator-Silicon (MIS) structure or a Metal-Insulator-Metal (MIM) structure.

Among other things, the MIM type capacitor has been mainly used for high performance semiconductor devices because it has low resistivity and does not cause parasitic capacitance derived from the depletion.

Recently, various technologies have been developed to provide a metal interconnection of a semiconductor device using copper, which has specific resistance lower than that of aluminum. Thus, various capacitors having the MIM structure employing copper electrodes have been suggested.

FIGS. 1A and 1B are cross-sectional views for illustrating a conventional fabricating method of a semiconductor device having a damascene interconnection structure.

Referring to FIG. 1A, a first metallic interconnection 15 and a second metallic interconnection 20 are formed on a bottom insulating layer 10 of a semiconductor substrate 1 in such a manner that the first and second metallic interconnections 15 and 20 do not form a step difference relative to the bottom insulating layer 10. After forming a metallic layer on the substrate including the first metallic interconnection 15 and the second metallic interconnection 20, the metallic layer is patterned to form a bottom electrode 25 of a capacitor on a top surface of the second metallic interconnection 20. Then, a dielectric layer 30 is formed on the bottom electrode 25. After that, another metallic layer is formed on the dielectric layer 30 and patterned to form a top electrode 35 of the capacitor on the bottom electrode 25. An interlayer dielectric layer 40 is then formed on the resultant structure including the top electrode 35.

Next, referring to FIG. 1B, a top surface of the interlayer dielectric layer 40 is planarized by a CMP process. Then, the interlayer dielectric layer 40 and the dielectric layer 30 are etched to form a via hole V1 for exposing a top surface of the first metallic interconnection 15. A first trench T1 is formed above the via hole V1 and a second trench T2 for exposing a top surface of the top electrode 35 is formed. Thereafter, the via hole V1 and the first and second trenches T1 and T2 are filled with Cu and then a CMP process is performed with respect to the Cu, thereby forming a damascene interconnection structure 45 and a contac plug 50.

However, such a convectional technique has problems as follws. A metallic Interconection process for applying a bias voltage to the bottom electrode of the capacitor must be additionally carried out, and the process becomes complex because the via hole V1 and the trench of the top electrode 35 cannot be simultaneously formed.

Meanwhile, as the capacitor plays a great role in the structure of a logic device, there is a technical need to improve the capacitance of the capacitor.

There are several methods for maintaining the capacitance of a capacitor in an appropriate value in a limited unit area, as seen from the relationship $C = \in As/d$ ($\in$: dielectric constant, As: surface area of electrode, d: thickness of dielectric element). That is, there has been suggested methods for maintaining a desired capacitance, including: a method for reducing the thickness of the dielectric element, a method of increasing the surface area of the electrode, and a method of using a material having a high dielectric constant $\in$. When considering the method of increasing the surface area of the electrode, since the conventional analog capacitor employs a metallic interconnection as top and bottom electrodes, the effective surface area of the conventional analog capacitor is formed as a plane. Therefore, the surface area of an electrode is physically limited.

FIGS. 2A to 2E are cross-sectional views for illustrating a conventional fabricating method of a semiconductor device having a capacitor and a contact plug between interlayer interconnections.

Referring to FIG. 2A, an interlayer dielectric layer 2 is formed, and a metallic conductive layer is formed and patterned on the interlayer dielectric layer 2 such that a bottom electrode 4a and a bottom interconnection 4b are formed.

Although not shown in the figures, a semiconductor substrate, on which the semiconductor device is formed, exists under the interlayer dielectric layer 2.

An inter-metallic dielectric layer 6 is formed on the bottom electrode 4a and the bottom interconnection 4b, and then planarized.

Referring to FIG. 2B, a contact hole 8 for exposing the bottom electrode 4a of the capacitor is formed using a conventional photolithographic process. The contact hole 8 exposing the bottom electrode may constitute an effective surface area of the capacitor, so the capacitor has a large effective surface area.

Referring to FIG. 2C, a dielectric layer 10 is formed on an entire surface of the substrate including the contact hole 8.

Referring to FIG. 2D, a via hole 12 for exposing the bottom interconnection 4b is formed using a conventional photolithographic process. After that, referring to FIG. 2E, a top interconnection conductive layer is formed and patterned on an entire surface of the semiconductor substrate, thereby forming a top electrode 14a and a top interconnection 14b of the capacitor.

However, the conventional MIM capacitor described above is limited in its ability to increase the capacitance of the capacitor because the effective surface area of the capacitor is formed as a plane.

SUMMARY OF THE INVENTION

Accordingly, embodiments of the present invention have been made to address the above mentioned problems occurring in the prior art, and it is an object of embodiments of the present invention to provide a method for fabricating a semiconductor device having a capacitor, in which a contact plug for applying a bias voltage to a bottom electrode can be simultaneously formed with the capacitor when forming the capacitor using a dual damascene process, thereby simplifying the manufacturing process and increasing the capacitance of the capacitor.

To achieve the above object, an embodiment of the present invention provides a method of fabricating a semiconductor device having a capacitor, the method including: forming a first conductive layer in a trench formed in a first insulating layer on a top surface of a silicon substrate; planarizing the first conductive layer and the first insulating layer; sequentially forming second, third, and fourth insulating layers on the planarized first conductive layer and first insulating layer; etching the fourth insulating layer to form a first pattern corresponding to a contact plug area and a capacitor area of the first conductive layer; depositing a fifth insulating layer on the first pattern and planarizing the fifth insulating layer; forming a second pattern on the fifth insulating layer and etching the fifth insulating layer to expose the first pattern of the fourth insulating layer in the contact plug area and the capacitor area using the second pattern as a mask; etching the third insulating layer using the exposed first pattern as a mask to expose the second insulating layer; etching the exposed second insulating layer to expose the first conductive layer in the contact plug area and the capacitor area; forming a second conductive layer on inner sidewalls and bottom walls of the exposed second, third, fourth, and fifth insulating layers; forming a capacitor insulating layer on the second conductive layer formed in the capacitor area; and forming a third conductive layer in the contact plug area and the capacitor area.

DETAILED DESCRIPTION OF THE INVENTION

Hereinafter, a semiconductor device having a capacitor according to a preferred embodiment of the present invention will be described in detail with reference to the accompanying drawings.

FIGS. 3A to 3G are views for illustrating a fabricating method of the semiconductor device having a capacitor according to a preferred embodiment of the present invention.

First, a dual damascene process using a self-aligned scheme will be described below for the sake of comprehension of the present invention. According to the dual damascene process employing the self-aligned scheme, a via hole and a trench can be simultaneously formed by performing the etching process at one time.

That is, a primary pattern to form a via hole can be formed at a lower portion of the damascene pattern, and then a secondary pattern to form a trench can be formed on an upper portion of the damascene pattern by interposing an interlayer dielectric layer therebetween.

After that, a dry etching process can be performed by first using the secondary pattern as an etch mask until the primary pattern is exposed, thereby forming the trench. Then continuing the etching process using the primary pattern as an etch mask, thereby forming the via hole.

Herein, the trench may have a width wider than that of the via hole. The dual damascene process employing the self-aligned scheme may have an advantage of reducing the number of mask processes as compared with a via-first scheme, in which the trench is formed after the via hole has been formed, and a trench-first scheme, in which the via hole is formed after the trench has been formed.

Figure 1A:
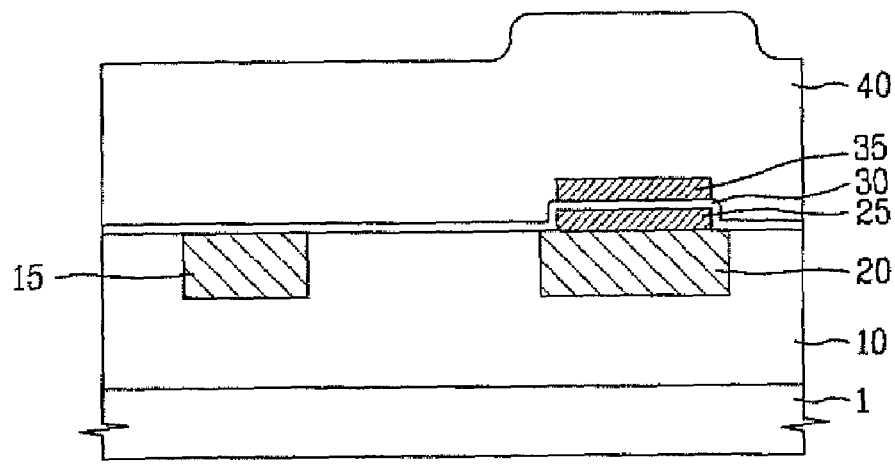
FIGS. 1A and 1B and 2A to 2E are cross-sectional views for illustrating a conventional fabricating method for an MIM capacitor of a dual damascene structure.
Figure 1B:
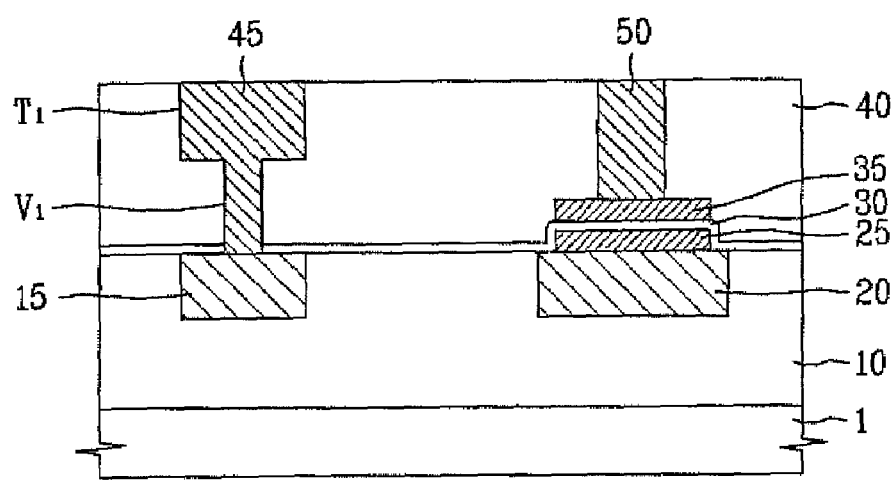
Figure 2A:
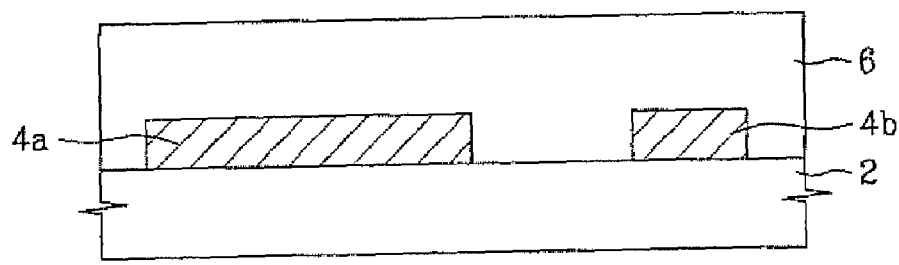
Figure 2B:
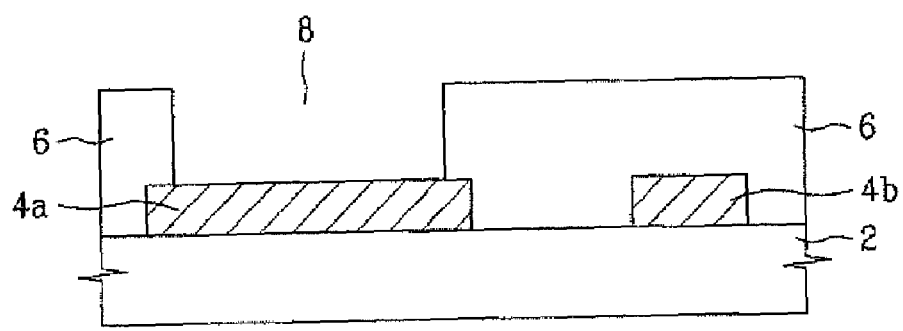
Figure 2C:
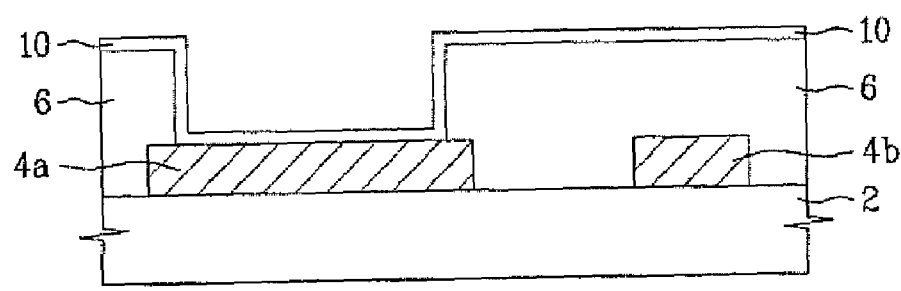
Figure 2D:
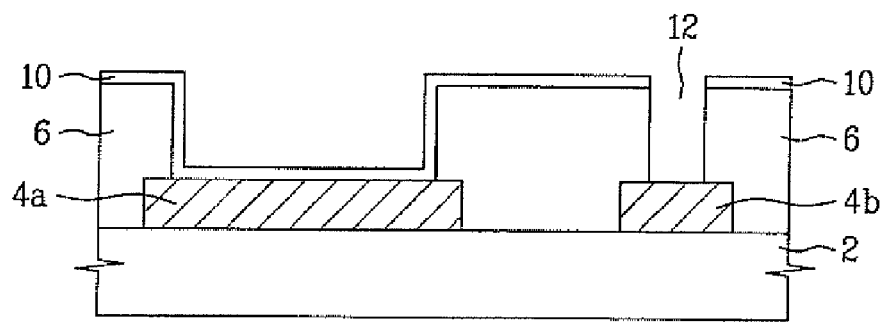
Figure 2E:
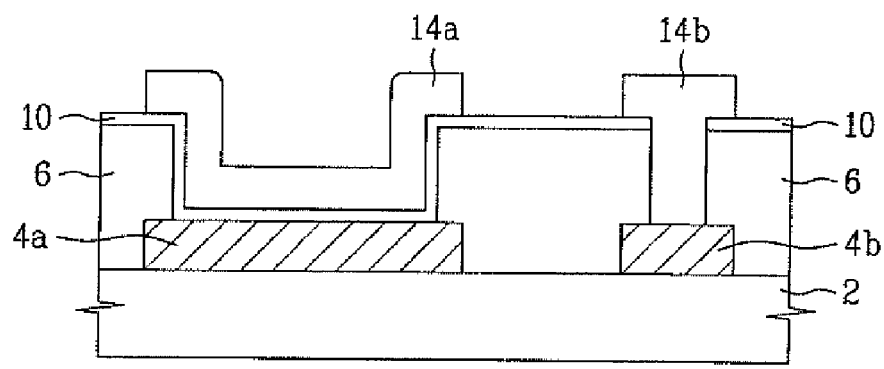
Figure 3A:
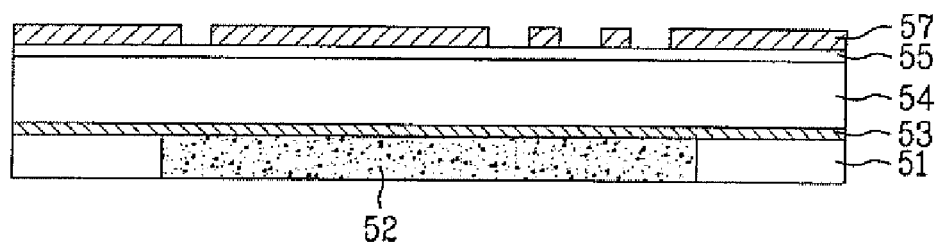
FIGS. 3A to 3G are cross-sectional views for illustrating a fabricating method of a semiconductor device having a capacitor according to a preferred embodiment of the present invention.

FIG. 3A is a sectional view showing a step of forming a first mask pattern 57 for forming a primary dual damascene pattern.

First, a first insulating layer 51 can be formed on a top surface of a silicon substrate (not shown) having a predetermined structure. The first insulating layer 51 can be patterned for a first conductor 52. Then, after depositing a first conductive layer such as a conductive metal, the first conductive layer can be planarized through a chemical mechanical polishing (CMP) process.

The CMP process can be continued until the top surface of the first insulating layer 51 is exposed, thereby forming the first conductor 52. In one embodiment, the first conductor 52 may serve as a bottom electrode of a capacitor which will be formed later.

Then, second, third, and fourth insulating layers 53, 54, and 55 can be sequentially deposited on the substrate including the first insulating layer 51 and the first conductor 52. In a preferred embodiment, the second and fourth insulating layers 53 and 54 include the same material. In one embodiment, the thickness of the fourth insulating layer can be greater than that of the second insulating layer. In a specific embodiment, the thickness ratio between the fourth and second insulating layers is 2:1.

In an embodiment, the first conductor 52 may serve as a bottom metal interconnection for applying a bias voltage to a bottom electrode of the capacitor.

The second and fourth insulating layers 53 and 55 may serve as etching stop layers. In a preferred embodiment, the second and fourth insulating layers 53 and 55 include a nitride layer, SIC (silicon carbide) or aluminum oxide.

The third insulating layer 54 may serve as an interlayer dielectric layer and include silicon oxide. Referring again to FIG. 3A, a first photoresist pattern 57 can be formed on the fourth insulating layer 55.

Figure 3B:
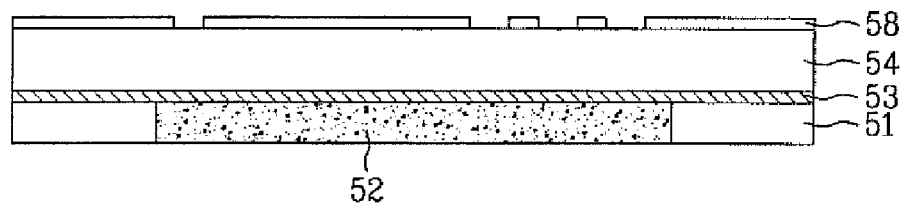

FIG. 3B is a sectional view showing a step for forming a primary dual damascene pattern 58.

In detail, the fourth insulating layer 55 can be selectively etched by performing a dry etching process using the first photoresist pattern 57 as an etch mask to form the primary dual damascene pattern 58.

After that, the first photoresist pattern 57 can be removed through a wet etching process, thereby obtaining the primary dual damascene pattern 58.

The primary dual damascene pattern 58 may serve as an etch stop layer when the secondary dual damascene pattern is formed later.

Figure 3C:
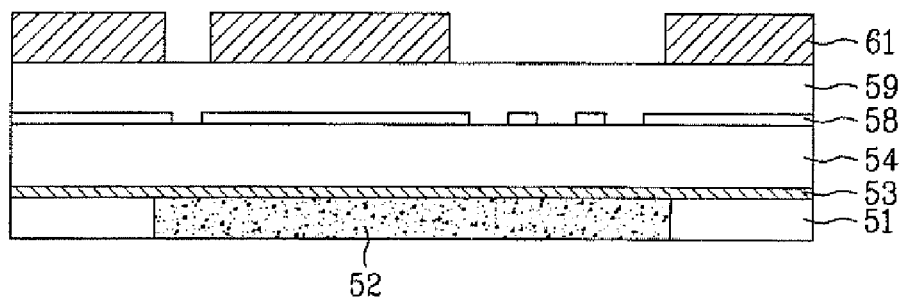

FIG. 3C is a sectional view showing a step of forming a second mask pattern 61 to form a secondary dual damascene pattern 58.

A fifth insulating layer 59 can be deposited on the fourth insulating layer 55, which has been selectively etched to form the primary dual damascene pattern 58. Then, a planarization process can be performed.

After planarizing the fifth insulating layer 59, a second photoresist pattern 61 can be formed on the fifth insulating layer 59. The second photoresist pattern 61 can act as the secondary dual damascene pattern.

Figure 3D:
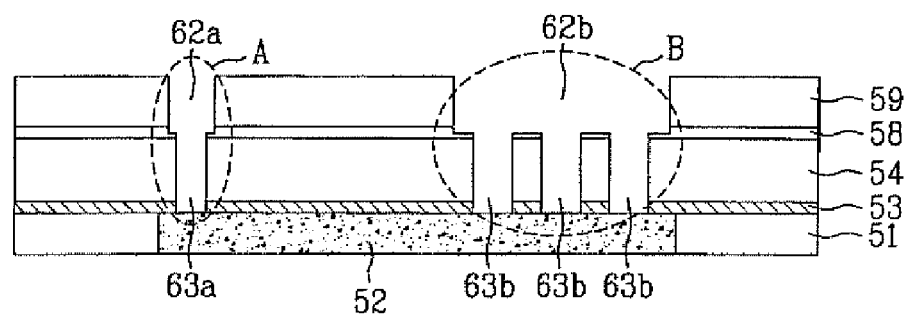

FIG. 3D is a sectional view showing a step of forming a dual damascene pattern having a plurality of via holes 63a and 63b and trenches 62a and 62b.

First, the fifth insulating layer 59 can be selectively etched using the second photoresist pattern 61 as an etch mask.

In an embodiment, the etching process can be performed until the primary dual damascene pattern 58 is exposed, thereby forming the trenches 62a and 62b.

Once the primary dual damascene pattern 58 is exposed, the center portion of the primary dual damascene pattern 58 can be etched to expose the third insulating layer 54.

Then, the etching can continue through the exposed third insulating layer 54 such that the second insulating layer 53 can be exposed.

Next, the second insulating layer 53 can be etched to expose the first conductor 52. At this time, the fourth insulating layer 58 can be etched because of it including a material identical to the material forming the second insulating layer 52 is also. However, for an embodiment where the thickness of the fourth insulating layer 58 is larger than that of the second insulating layer 53, the fourth insulating layer 58 is only partially etched as shown in FIG. 3D.

Through the above etching process, the via holes 63a and 63b can be formed as shown in FIG. 3D.

Here, the via hole 63a formed in the plug area communicates with the trench 62a formed above the via hole 63a.

In addition, a plurality of via holes 63b formed in the capacitor area communicate with trench 62b formed above the via holes 63b.

The via hole 63a and the trench 62a formed in the contact plug area can make contact with the bottom interconnection of the first conductor 52, thereby serving as contact plugs for applying a bias voltage to the bottom electrode of a capacitor.

Figure 3E:
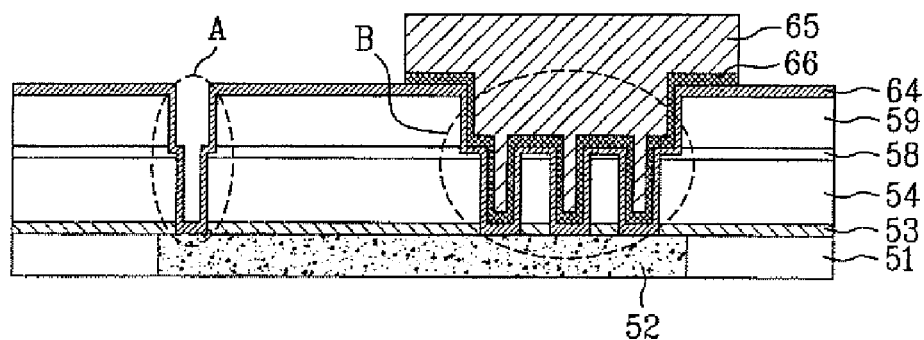

FIG. 3E is a sectional view showing a step of forming a bottom electrode and an insulating layer 66 of the capacitor. First, a second conductive layer 64 and a capacitor insulating layer 65 can be sequentially deposited on the entire surface of the structure having the via holes 63a and 63b and trenches 62a and 62b. Through the above process, the second conductive layer 64 and the insulating layer 65 can be deposited on the inner sidewalls and bottom walls of the via holes 63a and 63b.

Then, the capacitor insulating layer 65 can be partially etched through a photolithography process. In one embodiment, this can be accomplished by forming a third photoresist pattern 65 that covers the via holes 63b and the trench 62b formed in the capacitor area while opening other areas. A wet etching process can be performed using the third photoresist pattern 65 as an etch mask, thereby forming the capacitor insulating layer 66 only in the via holes 63b and the trench 62b formed in the capacitor area.

In other words, the capacitor insulating layer 66 is not formed in the via hole 63a and the trench 62a formed in the contact plug area.

The second conductive layer 64 formed in the capacitor area may serve as a bottom electrode of the capacitor. In a specific embodiment, the second conductive layer 64 may include tantalum nitride (TaN), titanium nitride (TiN) or tungsten nitride (WN), and can be prepared in the form of a multi-layered structure including tantalum nitride (TaN), titanium nitride (TiN) or tungsten nitride (WN). In addition, the capacitor insulating layer 66 may serve as a capacitor interlayer dielectric layer and include a nitride layer, TEOS (Tetraethoxysilane), tantalum based oxide, or aluminum based oxide.

Figure 3F:
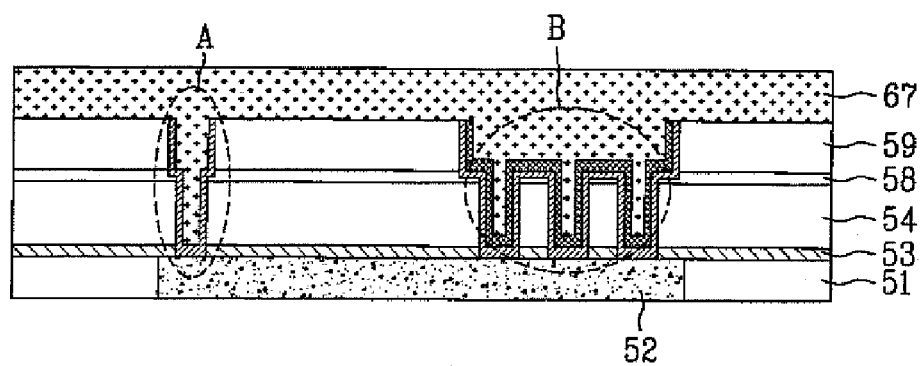

FIG. 3F is a sectional view showing a step of forming a contact plug area A for applying the bias voltage to a capacitor area B.

First, after removing the third photoresist pattern 65 used to form the capacitor insulating layer 66, a third conductive layer 67 can be deposited on the entire surface of the substrate including the capacitor insulating layer 66. In an embodiment, the third conductive layer 67 includes copper (Cu) and can be prepared in the form of a multi-layer including copper (Cu).

Then, a CMP process can be performed until the fifth insulating layer 59 is exposed, thereby planarizing the resultant structure by removing the third conductive layer 67, the capacitor insulating layer 65 and the second conductive layer 64 formed on the top surface of the fifth insulating layer.

Figure 3G:
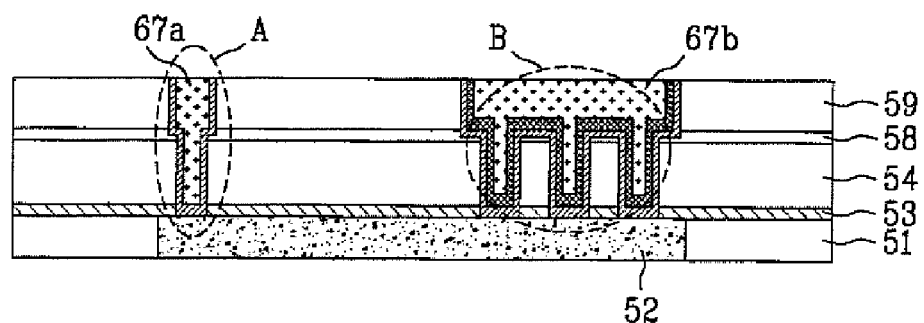

Through the above processes, as shown in FIG. 3G, a contact plug 67a is formed in the via hole 63a and the trench 62a formed in the contact plug area A, and a top electrode 67b is formed in the via holes 63b and the trench 62b formed in the capacitor area B.

The capacitor is formed on the inner walls of the via holes, so the surface area of the electrode can be increased as compared with that of an electrode provided in the conventional planar flat-type capacitor.

In addition, since the contact plug for applying the bias voltage to the bottom electrode can be formed simultaneously with the capacitor, the manufacturing process can be simplified.

Figure 4:
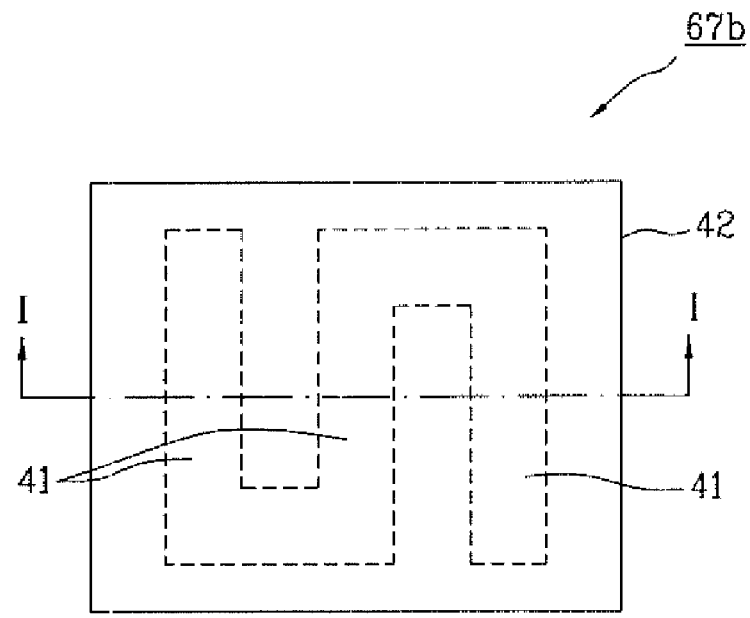
FIG. 4 is a view illustrating the structure of a top electrode shown in FIG. 3G according to an embodiment of the present invention.

FIG. 4 is a view illustrating the structure of the top electrode shown in FIG. 3G. A section taken along line I-I of FIG. 4 shows the capacitor area of FIG. 3G.

As shown in FIG. 4, the top electrode 67b can be divided into first electrodes 41 formed in each via hole and a second electrode 42 integrally formed with the first electrode 41 and provided in the trench.

Although not shown in the figures, a pad electrode can be formed on the second electrode 42 in order to apply the voltage to the second electrode 42.

Referring to FIG. 4, the first electrodes 41 can be connected to each other while forming a meander structure. The second electrode 42 has a rectangular shape such that the second electrode 42 can overlap all first electrodes 41.

Figure 5:
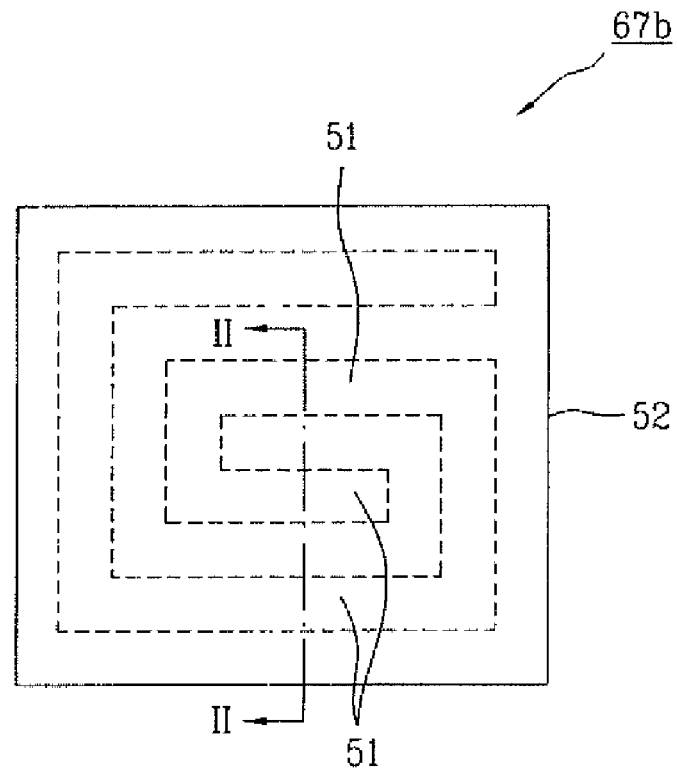
FIG. 5 is a view illustrating the structure of a top electrode shown in FIG. 3G according to another embodiment of the present invention.

FIG. 5 is a view illustrating the structure of the top electrode shown in FIG. 3G according to another embodiment of the present invention. A section taken along line II-II of FIG. 5 shows the capacitor area of FIG. 3G.

As shown in FIG. 5, the first electrodes 51 can be connected to each other while forming a spiral structure and the second electrode 52 can have a rectangular shape such that the second electrode 52 can overlap all first electrodes 51.

If the capacitor has the meander structure as shown in FIG. 4 or the spiral structure as shown in FIG. 5, the contact area of the capacitor integrated on a unit area can be enlarged.

The semiconductor device having the capacitor according to embodiments of the present invention can have advantages as follows:

First, the damascene structure and the capacitor can be simultaneously formed, so that the number of manufacturing steps can be reduced.

In addition, since the capacitor can have a meander structure or a spiral structure, the surface area of the capacitor can be enlarged.

The embodiments and the accompanying drawings illustrated and described therein are intended to not limit the present invention, and it will be obvious to those skilled in the art that various changes, variations and modifications can be made to the present invention without departing from the technical spirit of the invention.

I claim:

1. A method for manufacturing a semiconductor device, the method comprising the steps of:

forming a first insulating layer on a top surface of a semiconductor substrate;

etching the first insulating layer to form a trench;

depositing a first conductive layer on the insulating layer and filling the trench;

performing a first planarization process to expose a top surface of the first insulating layer while leaving the first conductive layer in the trench;

sequentially forming a second insulating layer, a third insulating layer, and a fourth insulating layer on the planarized first insulating layer;

etching the fourth insulating layer to form a first pattern for a contact plug area and a capacitor area of the first conductive layer;

depositing a fifth insulating layer on the fourth insulating layer having the first pattern and planarizing the fifth insulating layer;

forming a second pattern on the fifth insulating layer to expose the fifth insulating layer on the contact plug area and the capacitor area;

etching the exposed fifth insulating layer using the second pattern as a mask to expose the first pattern;

etching the third insulating layer using the first pattern as a mask to expose the second insulating layer;

etching the exposed second insulating layer to expose the first conductive layer in the contact plug area and the capacitor area;

forming a second conductive layer on the exposed first conductive layer and inner sidewalls of the exposed second, third, fourth, and fifth insulating layers;

forming a capacitor insulating layer on the second conductor formed in the capacitor area; and forming a third conductive layer in the contact plug area and the capacitor area.

2. The method according to claim 1, wherein the second conductive layer corresponds to a capacitor bottom electrode, and the third conductive layer formed in the capacitor area corresponds to a capacitor top electrode.

3. The method according to claim 1, wherein the second conductive layer comprises tantalum nitride (TaN) or a multilayer including tantalum nitride (TaN).

4. The method according to claim 1, wherein the second conductive layer comprises titanium nitride (TiN) or a multilayer including titanium nitride (TiN).

5. The method according to claim 1, wherein the second conductive layer comprises tungsten nitride (WN) or a multilayer including tungsten nitride (WN).

6. The method according to claim 1, wherein the capacitor insulating layer comprises a nitride layer, TEOS (Tetraethoxysilane), tantalum based oxide, or aluminum based oxide.

7. The method according to claim 1, wherein the second insulating layer and the fourth insulating layer are formed of the same material.

8. The method according to claim 1, wherein the second insulating layer and the fourth insulating layer are formed of a nitride layer, SiC (silicon carbide), or aluminum oxide.

9. The method according to claim 7, wherein the fourth insulating layer has a thickness larger than a thickness of the second insulating layer.

10. The method according to claim 1, wherein etching the third insulating layer using the first pattern as a mask and etching the exposed second insulating layer forms a meander structure in the second and third insulating layers on the capacitor area of first conductive layer.

11. The method according to claim 1, wherein etching the third insulating layer using the first pattern as a mask and etching the exposed second insulating layer forms a spiral structure in the second and third insulating layers on the capacitor area of the first conductive layer.

* * * * *